United States Patent
Carneling

(10) Patent No.: US 6,270,374 B1
(45) Date of Patent: *Aug. 7, 2001

(54) ELECTRICAL CONNECTOR WITH WAFER FOR VIDEO POSITIONING AND SURFACE MOUNT HOLDING FEATURE

(75) Inventor: Hard A. Carneling, Valla (SE)

(73) Assignee: Berg Technology, Inc., Reno, NV (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,073

(22) Filed: Dec. 11, 1998

Related U.S. Application Data

(60) Provisional application No. 60/071,862, filed on Jan. 20, 1998.

(51) Int. Cl.$^7$ .................................................... H01R 13/71
(52) U.S. Cl. ............................ 439/488; 439/940; 382/123
(58) Field of Search ..................................... 439/488, 491, 439/65, 80, 79, 83, 562, 564, 571, 572, 940; 29/740, 840; 422/108, 62; 382/123, 114; 356/239

(56) References Cited

U.S. PATENT DOCUMENTS

| | | |
|---|---|---|
| 3,601,770 | 8/1971 | Bowley ........................... 339/125 R |
| 3,904,266 | 9/1975 | Fitzpatrick ........................... 439/79 |
| 4,025,147 | 5/1977 | Van Arsdale et al. ........ 339/176 MP |
| 4,462,046 | 7/1984 | Spight ................................... 358/101 |
| 4,496,207 | 1/1985 | Ensminger ........................ 339/99 R |
| 4,616,893 | 10/1986 | Feldman ............................ 339/14 R |
| 4,628,410 | 12/1986 | Goodman et al. .................... 361/413 |
| 4,629,278 | 12/1986 | Norton et al. ....................... 339/134 |
| 4,691,971 | 9/1987 | Hahn ...................................... 439/78 |
| 4,826,442 | 5/1989 | Douty et al. ........................... 439/92 |
| 4,863,233 * | 9/1989 | Nienaber et al. .................... 439/610 |
| 4,907,987 | 3/1990 | Douty et al. ......................... 439/571 |
| 4,955,819 * | 9/1990 | Harting et al. ......................... 439/79 |
| 5,004,430 | 4/1991 | DelGuidice et al. ................ 439/350 |
| 5,007,844 | 4/1991 | Mason et al. .......................... 439/68 |
| 5,022,862 * | 6/1991 | Martin et al. ........................ 439/940 |
| 5,026,291 | 6/1991 | David ..................................... 439/67 |
| 5,037,327 * | 8/1991 | Van Woensel ....................... 439/571 |
| 5,040,291 | 8/1991 | Janisiewicz et al. .................. 29/840 |
| 5,096,440 | 3/1992 | Katsumata ........................... 439/570 |
| 5,120,256 | 6/1992 | Walden ................................. 439/553 |
| 5,186,654 | 2/1993 | Enomoto et al. .................... 439/570 |
| 5,189,707 | 2/1993 | Suzuki et al. ............................. 382/8 |
| 5,259,789 | 11/1993 | Patel et al. ........................... 439/570 |
| 5,334,049 | 8/1994 | Kachlic et al. ...................... 439/567 |
| 5,383,797 * | 1/1995 | Seong et al. ......................... 439/940 |
| 5,386,489 | 1/1995 | Schell .................................. 439/571 |
| 5,395,265 | 3/1995 | DeMondi ............................ 439/553 |
| 5,423,691 | 6/1995 | Pickles ................................ 439/327 |
| 5,568,593 | 10/1996 | Demarest et al. ..................... 359/82 |
| 5,591,050 | 1/1997 | Sueoka ................................ 439/607 |
| 5,593,307 | 1/1997 | Bale ...................................... 439/79 |
| 5,609,500 * | 3/1997 | Holmes et al. ...................... 439/940 |
| 5,613,864 * | 3/1997 | Northey .............................. 439/940 |
| 5,622,519 | 4/1997 | Bixler et al. ........................ 439/570 |
| 5,713,762 | 2/1998 | Mitra et al. ......................... 439/607 |
| 5,738,534 | 4/1998 | Ingles et al. ........................... 439/83 |
| 5,738,546 | 4/1998 | Burroughs ........................... 439/620 |

FOREIGN PATENT DOCUMENTS

| | | |
|---|---|---|
| 39225958 C1 | of 1991 | (DE) . |
| 0 210 686 | 4/1987 | (EP) . |

* cited by examiner

Primary Examiner—Hien Vu
(74) Attorney, Agent, or Firm—M. Richard Page; Steven M. Reiss

(57) ABSTRACT

An electrical connector having a metal plate which is mounted under the housing with hot riveting. Location pegs are made so that low mounting force is possible. A wafer which is black in color or has another contrasting color makes it possible for a video camera to record the true position of the terminals. The surface of the top side of the housing is suited for vacuum pick up.

28 Claims, 7 Drawing Sheets

ELECTRICAL CONNECTOR WITH WAFER FOR VIDEO POSITIONING AND SURFACE MOUNT HOLDING FEATURE

CROSS-REFERENCE TO RELATED APPLICATIONS

This application claims the benefit of U.S. Provisional Patent Application Ser. No. 60/071,862, filed on Jan. 20, 1998 and herein incorporated by reference.

BACKGROUND OF THE INVENTION

1. Field of the Invention

The present invention relates to electrical connectors and more particularly to hold-down devices for electrical connectors.

2. Brief Description of Prior Developments

One conventional method of positioning connectors and other electronic components on a printed circuit board (PCB) is by means of surface mount technology (SMT) through-mount or intrusive reflowed terminals. Intrusive reflow is the pre-location of carefully applied dosage amount of solder in the plated through hole such that after reflow (and not wave solder) operation a uniformly filled solder meniscus is formed with the terminal located in the hole. The connector may be picked up by a vacuum nozzle or similar transport means from a tape and then appropriately positioned and fixed on the PCB.

There is a need for such a device which is available on the (redundant) underside of a connector whether this connector is a receptacle or a plug connector. Unlike many other hold-down devices, the means to activate the hold-down mechanism in association with extraneous mechanical forces is avoided. This feature can be important in order to avoid rupture of delicate multi-layer boards, and thus cause undue stresses at the terminal solder connections.

SUMMARY OF THE INVENTION

In the connector of the present invention a metal plate is mounted under the housing with hot riveting. Location pegs are made so that low mounting force is possible. A wafer which has a dark or other contrasting color to make it possible for a video camera to record the true position of the terminals. The surface of the top side of the housing is suited for vacuum pick up.

BRIEF DESCRIPTION OF THE DRAWINGS

The connector of the present invention is further described with reference to the accompanying drawings in which.

DETAILED DESCRIPTION OF THE DRAWINGS

Figure 1:
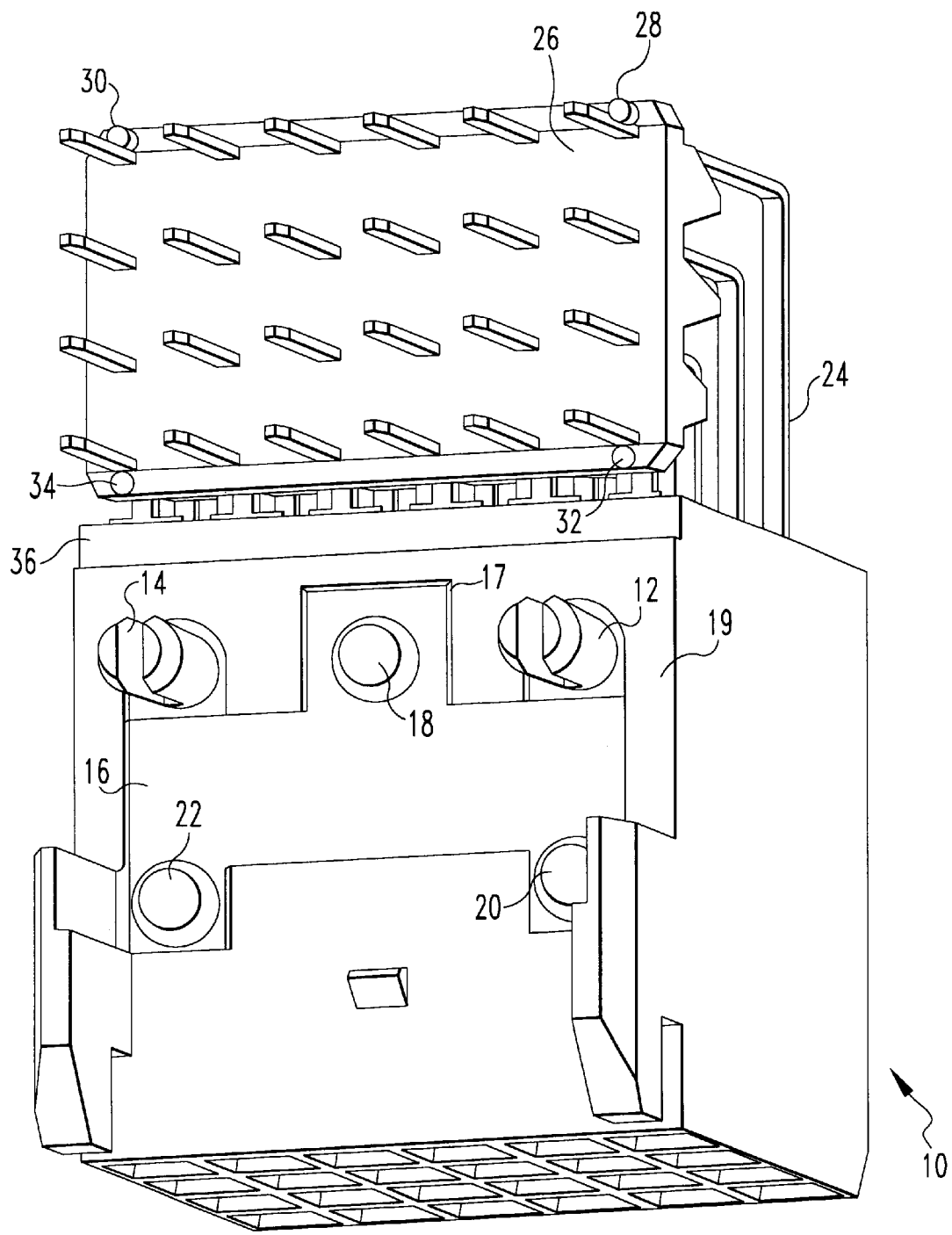
FIG. 1 is a bottom perspective view of a preferred embodiment of the receptacle of the present invention and a wafer used in its placement.

Referring to FIG. 1, a METRAL® brand receptacle which is commercially available from FCI/Berg Electronics Group, Inc. located at Etters, Pa. is shown generally at numeral 10. This header includes a bifurcated resilient location pin 12 and location pin 14 on the underside 19 of the connector which includes a recessed area with a perimeter 17. This recessed area contains three hot rivet pegs 18, 20 and 22. An additional feature of this connector according to the novelty is that an appropriately stamped metal plate 16 with three circular apertures (not shown) accepts the hot rivet pegs 18, 20 and 22 while fitting into the recessed area defined by the perimeter 17.

Extending rearwardly and downwardly from the insulation housing are a plurality of contact terminals 24 which are grouped and bent at an angle of 90 degrees to engage and pass through a wafer 26. This wafer preferably has stand-offs 28, 30, 32 and 34 with a height and location such that they, or the lower surface of the wafer disturb the relatively soft paste on opposing area after location on the printed circuit board (see FIG. 5). In addition, a channel or space 36 is located along connector width intermediary to the underside 19 of the connector and the wafer 26. Its function will be explained later.

Figure 2:
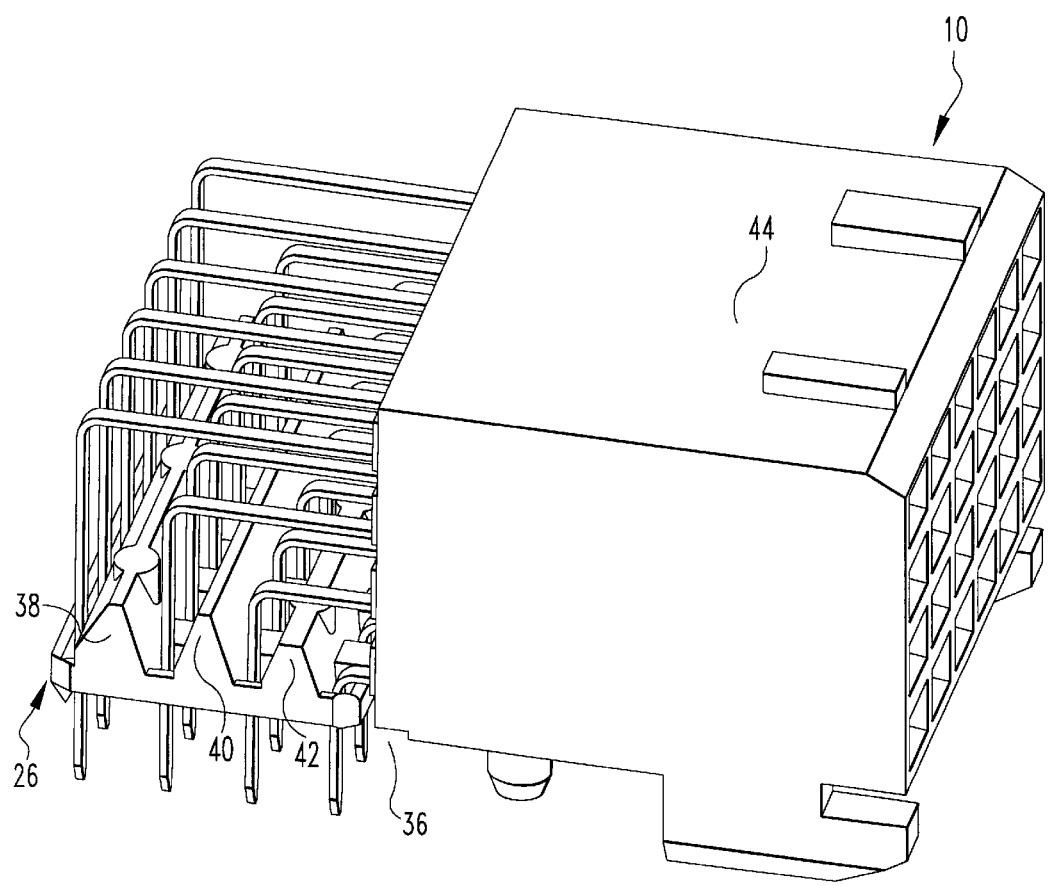
FIG. 2 is a top perspective view of the connector and wafer shown in FIG. 1.

As is further evident from FIG. 2, the wafer has a plurality of ridges 38, 40 and 42 and between these ridges there are grooves which contain the apertures (not shown) through which the connector terminal bent leads are introduced. Such a wafer is preferably black in color to facilitate a visual inspection of the terminals. Further, as shown such a connector will have a flat surface 44 typically suited to vacuum pick-up by a robot assisted connector assembly on the board.

Figure 2A:
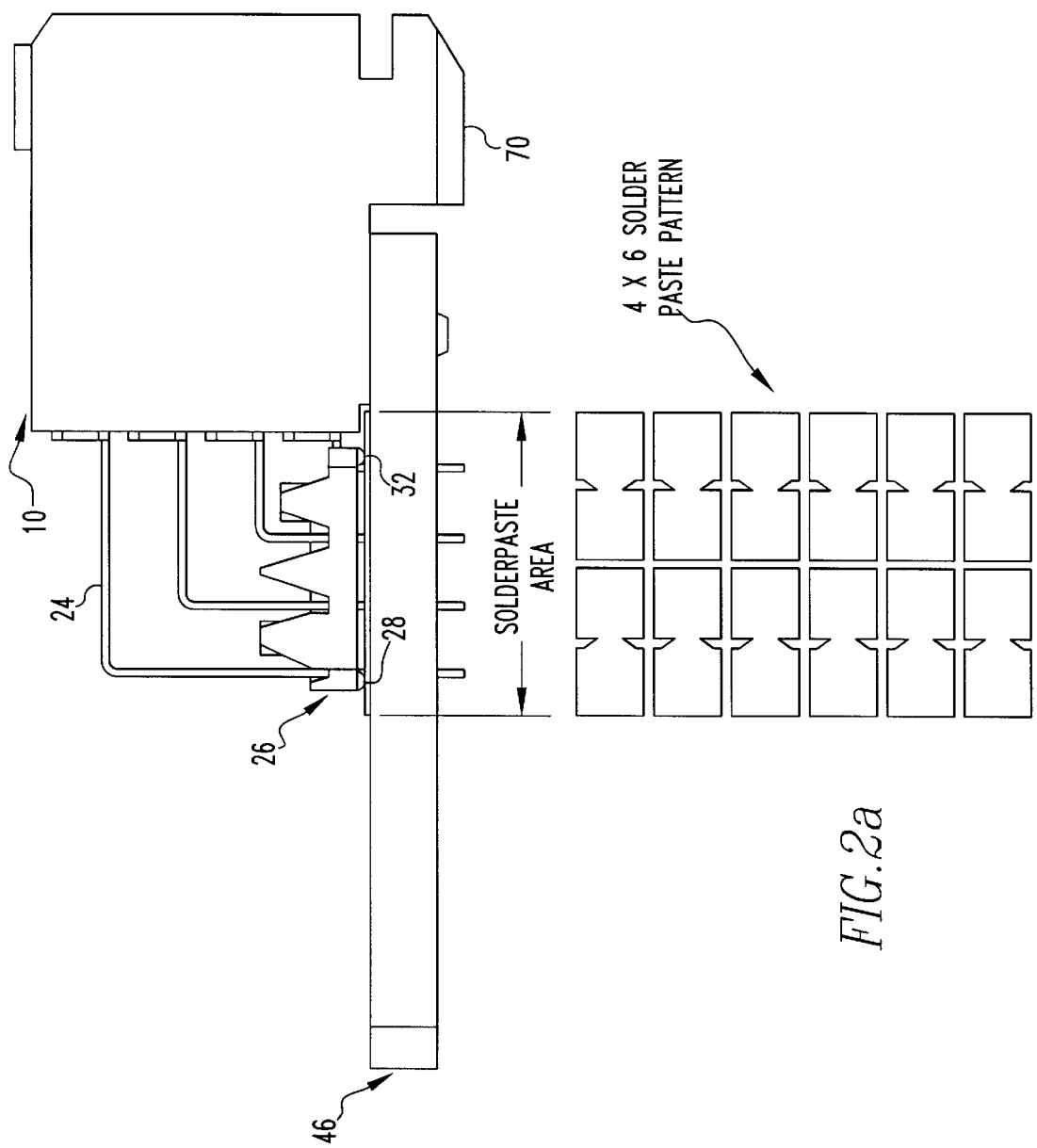
FIG. 2a is a side elevational view of the receptacle and wafer shown in FIG. 2 and a plan view of the wafer.
Figure 2B:
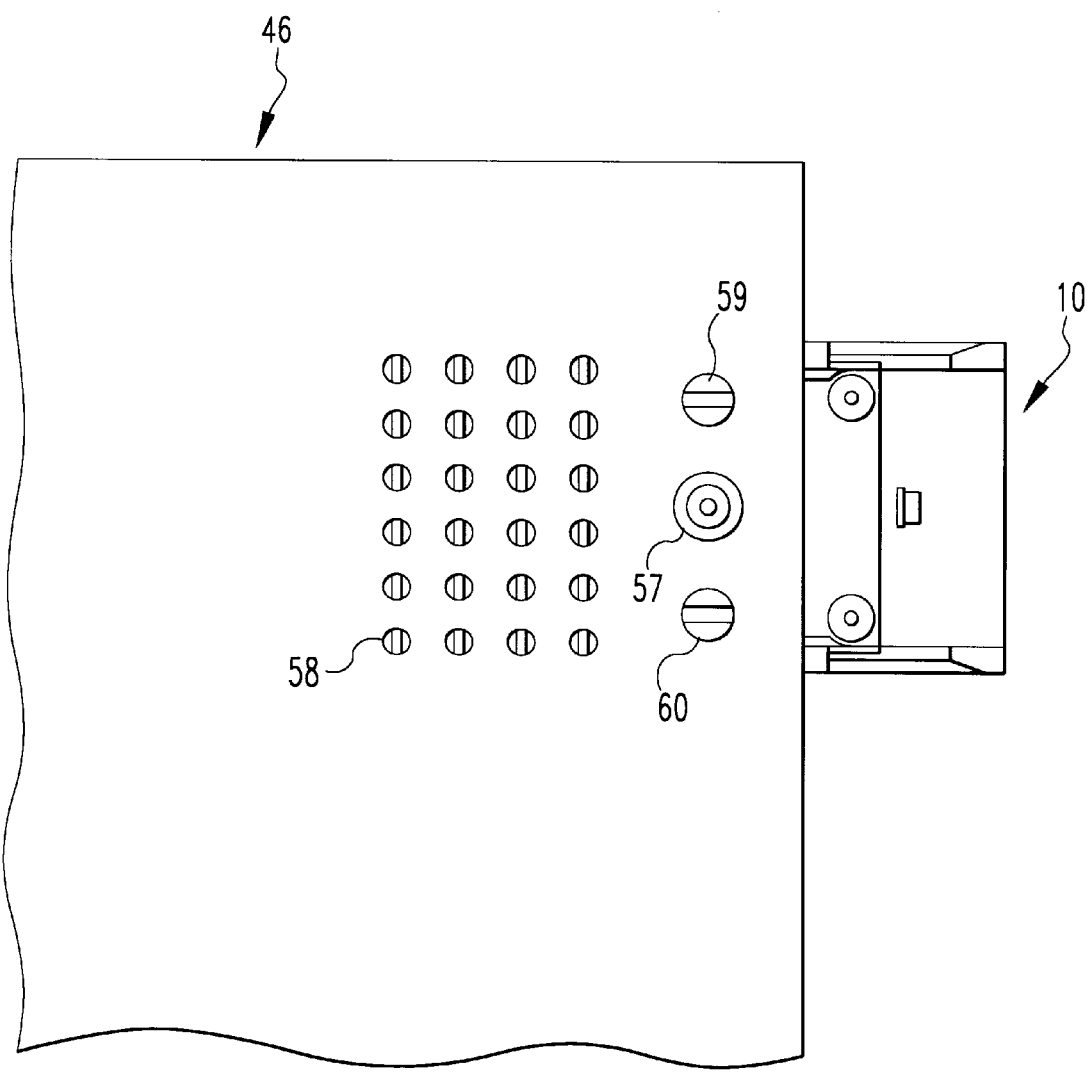
FIG. 2b is a bottom plan view of the receptacle and wafer shown in FIG. 2 and a PCB on which it is mounted.
Figure 3:
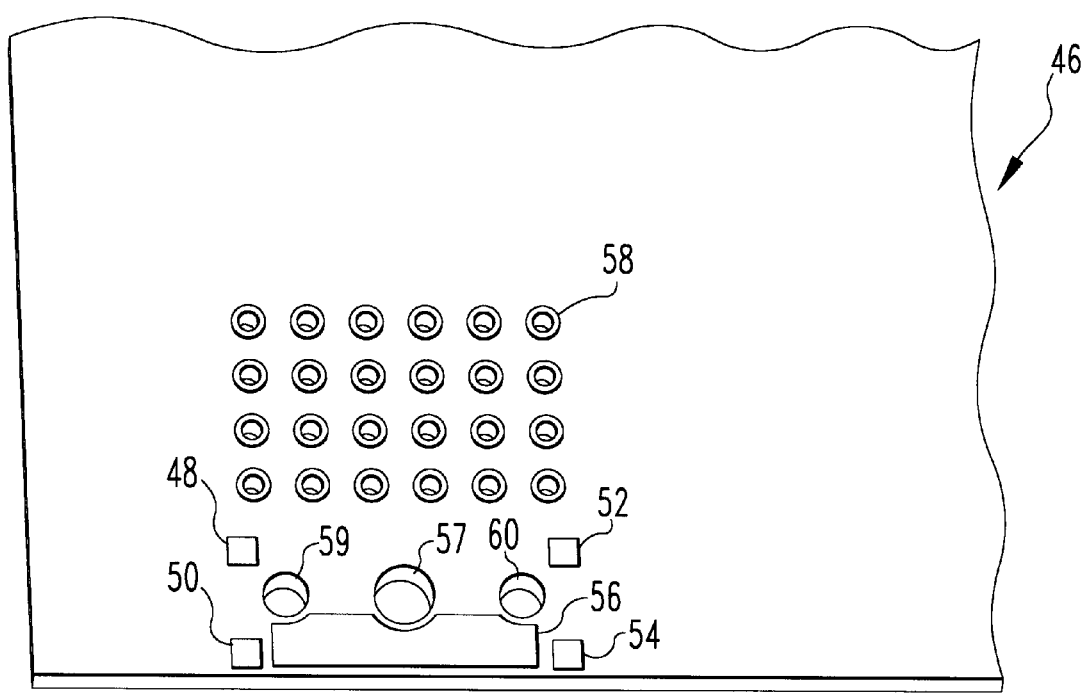
FIG. 3 is a top perspective view of a PCB on which the connector shown in FIG. 1 may be mounted.

Referring to FIGS. 2a, 2b and 3, the PCB is shown generally in fragment at numeral 46. On the upper surface of the PCB are reference pads 48, 50, 52 and 54. The elongate pad 56 is positioned to be located opposite to the connector metal plate 16. Further, the recess 57 allows the free passage of the rivet peg 18, while the locating pins 12 and 14 are resiliently engaged in the recesses 59 and 60. The edge of such a board is located behind the ears as at ear 70 of this connector. Such boards are characterized in that they are thinner towards the edges, in addition to the surface waviness compared to the surface of the plastic underside 19. Such problems generally result in a mutual space between the connector and board. This is a significant problem which needs to be overcome, particularly when the connector length (or number of positions) increase. To start with prior to the reflow operation, once the connector sits on the PCB, the reference pads 48, 50, 52 and 54 of the board are in contact with the opposite four locations on the underside 19 of the connector.

Further, the board 46 contains terminal receiving apertures 58 which are plated through. As a mater of detail specific to one preferred process, a metal stencil (not shown) of a certain thickness with appropriately positioned apertures, is positioned over board in the connector area. This stencil with apertures extends not only over the area of apertures 58, but also the elongate pad area 56. Once the stencil is properly positioned and laid flat over board 46, the apertures can be filled by the soft solder paste (for example, in the area 58, see FIG. 2a), with surface leveling to the thickness of the stencil. The stencil is removed to leave a deposit of soft solder paste of a desired thickness and area in specified locations.

As can be seen from FIG. 1, after assembly of the metal plate 16 to the recessed zone of the connector, hot rivet pegs 18, 20 and 22 allow rigid fixation of this plate to the connector. The thickness of this plate 16 is such that its average surface is either flush or slightly under the surface level of the remaining connector underside 19. The board 46 (see FIG. 5) can be compensated for by a leveling effect on the soft paste located in the mutual space opposite to the plate 16. Once the connector assembly 10 is located on board, the terminals push through the solder deposit and enter the apertures 58. Simultaneously, the mutual space between the metal plate 16 and elongate pad 56, as previously explained, is adequately filled by the soft solder paste. Subsequent reflow will result in a melting of solder, while the surface tension ensures to drag the solder melt between the terminals and plated through holes, and also between plate 16 and board. Any surplus solder is trapped in the channel or space 36. This prevents conditions for short-circuit between adjacent terminals after reflow.

Figure 5:
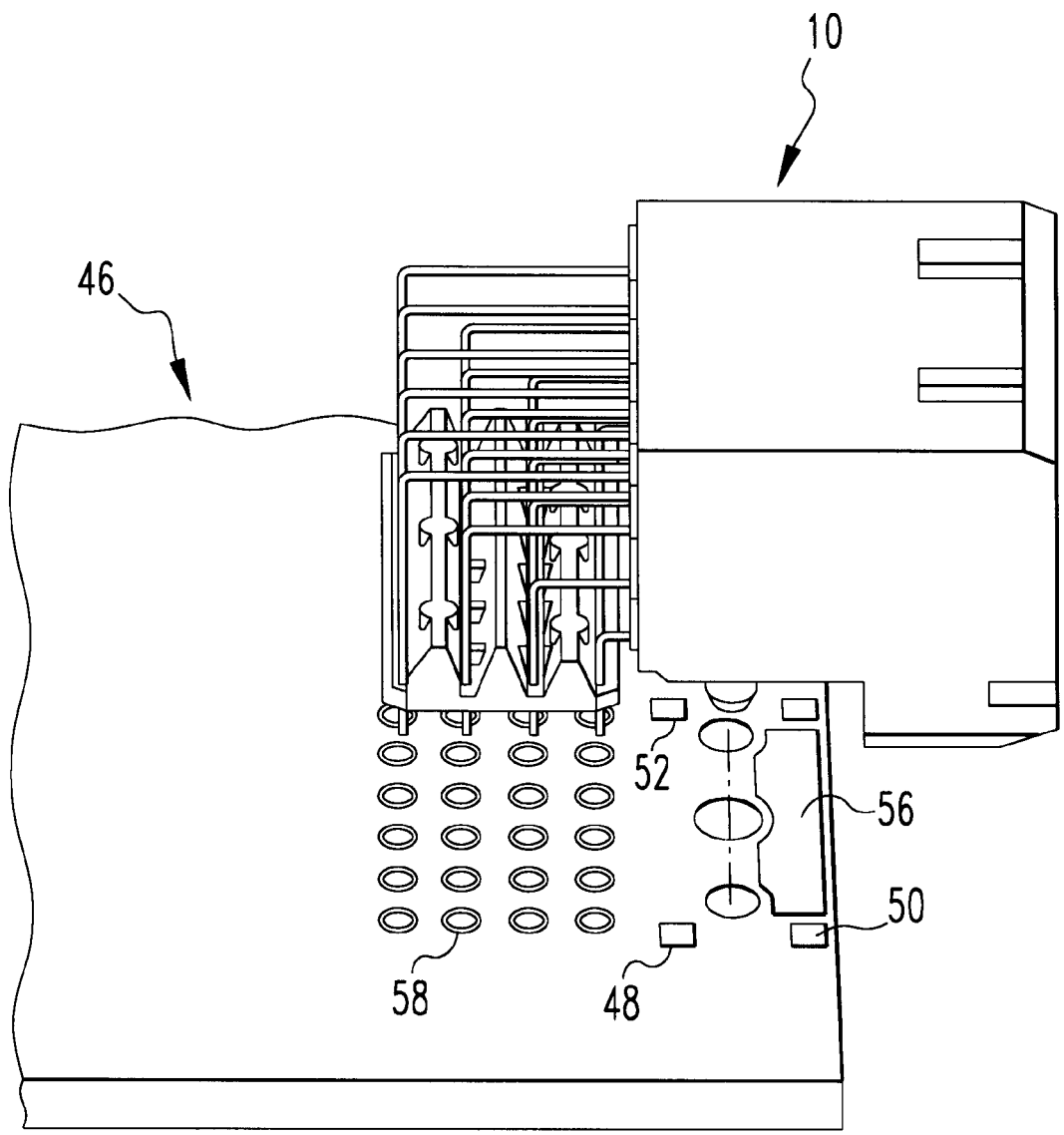
FIG. 5 is a top perspective view of a connector of FIG. 1 superimposed over a PCB prior to mounting.

Referring to FIG. 5, it will also be appreciated that the pad 56 for the hold-down has a belt of soft paste, its top surface being flush with the reference surfaces 48, 50, 52 and 54. Such reference surfaces 48, 50, 52 and 54 are important for surface mount hold-down devices due to the inherent waviness of the board in relation to the potential length (positions) of connectors, and the fact that boards often tend to be thinner towards their edges.

Referring again to FIG. 1, usually the hold-down plate 16 is located on the connector underside 19 within a recessed area within perimeter 17 such that in the final assembly the surface of this hold-down plate is about 0.05 mm below the aforesaid underside surfaces. At the rear of the connector underside 19 and located in an intermediary space with the wafer 26, is located an open space 36. When this connector is lowered to engage the board, prior to reflow the resultant additional soft paste which is displaced is trapped in the open space 36. This measure is important to restrict the movement of molten solder paste in a specific area, thus preventing undesirable short circuits with tracks in the vicinity. Also in the connector position, the location pins 12 and 14 resiliently engage the holes 59 and 60 while the hot riveted peg 18 passes freely through another hole 57. The other two hot rivet pegs 20 and 22 do not need to fit holes since their location is beyond the edge of the PCB (see FIG. 5).

Figure 4:
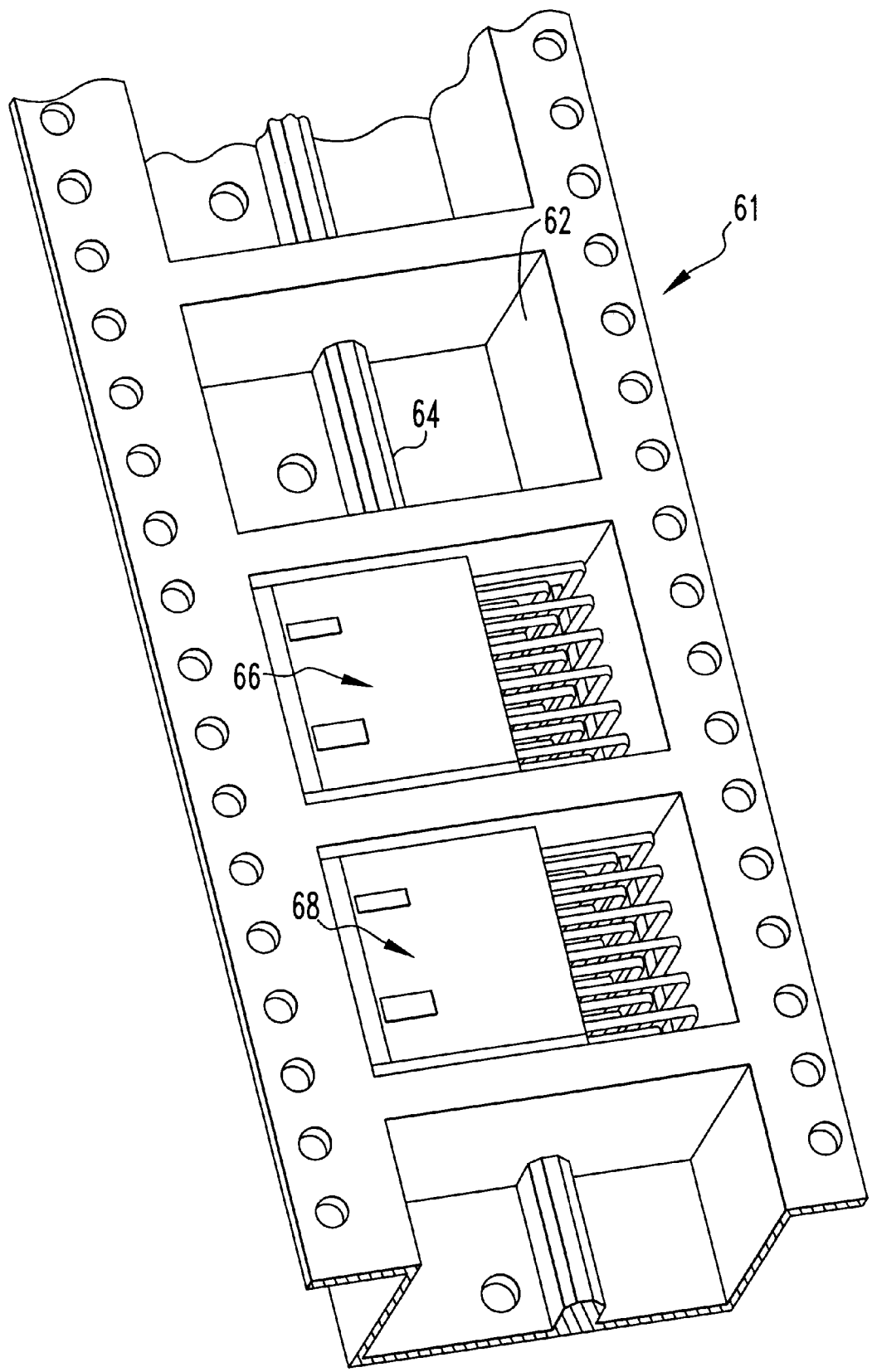
FIG. 4 is a top perspective view of a tape carrying system holding two connectors similar to that shown in FIG. 1.

Referring to FIG. 4, it will be seen that the receptacle may be transported on a tape shown generally at number 61 which has a plurality of recesses as at recess 62 and a longitudinal axial rib 64. Receptacles as described above such as 66 and 68 are positioned in the recesses and are then subsequently removed by vacuum pick up on their upper surfaces for placement on a PCB.

The embodiment and method shown for a horizontal receptacle connector may equally be adapted to a vertical positioned connector, and this concept can equally apply to plug connectors.

It will be appreciated that a connector has been described which is adapted to be efficiently placed on a PCB, particularly by video positioning. As is known, a video positioning apparatus determines the location of a first object relative to a second object. Based upon this location, the video positioning apparatus directs the movement of a placement machine transporting the first object. In the present invention, the video positioning apparatus can sense differences in optical characteristics between the conductive terminals and the insulative wafer. Specifically, the present invention utilizes a dark colored wafer, preferably black, to exaggerate further the difference in optical characteristics of the terminals and the wafer. This allows for proper insertion of the terminals into the PCB.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical connector mounted on a substrate with assistance from a video positioning apparatus, said connector having:
   an insulative housing;
   a plurality of terminals extending through said housing; and
   a wafer from which said terminals extend;
   wherein said wafer is made from a material having a dark color so said terminals and said wafer have different optical characteristics sensed by the video positioning apparatus for proper positioning of said terminals relative to the substrate during mounting, a lower surface of said housing includes a recess, and a metal plate resides in said recess.

2. The electrical connector of claim 1 wherein the metal plate resides entirely within the recess in the lower surface of the housing.

3. The electrical connector of claim 2 wherein the wafer has a side which has a dark color.

4. The electrical connector of claim 3 wherein the color of the dark colored side of the wafer is black.

5. The electrical connector of claim 2 wherein the terminals extend first axially then perpendicularly from the housing.

6. The electrical connector of claim 5 wherein the wafer has a plurality of transverse apertures and the terminals pass through said apertures.

7. The electrical connector of claim 6 wherein the wafer has a plurality of ridges and between the ridges there are grooves through which the apertures pass.

8. The electrical connector of claim 7 wherein the wafer has a side having a dark color and the ridges are in opposed relation to said side having a dark color.

9. The electrical connector of claim 8 wherein the wafer has an upper side from which the ridges extend and a lower side which is the side having a dark color.

10. The electrical connector of claim 9 wherein the dark side of the wafer is superimposed on and faces the substrate.

11. The electrical connector of claim 10 wherein the metal plate is superimposed on the substrate.

12. The electrical connector of claim 2 wherein the housing has an upper and lower side and the metal plate is on the lower side.

13. The electrical connector of claim 12 wherein there is a vacuum pick up surface on the upper surface of the housing.

14. The electrical connector of claim 13 wherein the metal plate on the housing is superimposed over a solder pad on the substrate.

15. The electrical connector of claim 14 wherein solder paste is interposed between the metal plate and the solder pad.

16. The electrical connector of claim 15 wherein a plurality of leveling pads are interposed between the lower side of the housing and the substrate.

17. The electrical connector of claim 16 wherein solder paste is interposed between the wafer and the PCB.

18. The electrical connector of claim 17 wherein there is at least one stand off interposed between the wafer and the PCB.

19. The electrical connector of claim 1 wherein the connector is a receptacle.

20. The electrical connector of claim 1 wherein the wafer has a side which has a color which contrasts with the terminals.

21. The electrical connector of claim 1 wherein a side of the wafer has a color which contrasts with colors of other elements of the connector.

22. An electrical connector mounted to a substrate with assistance from a video positioning apparatus, the connector comprising:

a housing having a lower surface with a recess;

a plurality of terminals extending through said housing;

a surface mount metal hold-down residing in said recess on said lower surface of said housing and adapted to secure the connector to the substrate; and a wafer through which said terminals extend;

wherein said wafer is made from a material having a dark color so that said terminals and said wafer have different optical characteristics whereby the video positioning apparatus can sense said different optical characteristics and properly position said terminals relative to the substrate during mounting.

23. The electrical connector as recited in claim 22, wherein said hold-down resides entirely within said recess.

24. The electrical connector as recited in claim 23, wherein said hold-down is generally flush with said lower surface.

25. The electrical connector as recited in claim 22, wherein said lower surface includes a peg, said peg retaining said hold-down.

26. The electrical connector as recited in claim 25, wherein said peg retains said hold-down by hot riveting.

27. The electrical connector as recited in claim 22, wherein said hold-down is located entirely within a periphery of said lower surface.

28. The electrical connector as recited in claim 22, wherein said dark color is black.

* * * * *